United States Patent
Mishima et al.

(10) Patent No.: US 10,447,231 B2
(45) Date of Patent: Oct. 15, 2019

(54) VIBRATION TRANSDUCER

(71) Applicant: Yokogawa Electric Corporation, Musashino-shi, Tokyo (JP)

(72) Inventors: Takeshi Mishima, Musahino (JP); Hiroshi Suzuki, Musahino (JP)

(73) Assignee: Yokogawa Electric Corporation, Tokyo (JP)

( * ) Notice: Subject to any disclaimer, the term of this patent is extended or adjusted under 35 U.S.C. 154(b) by 197 days.

(21) Appl. No.: 15/808,227

(22) Filed: Nov. 9, 2017

(65) Prior Publication Data

US 2018/0138887 A1 May 17, 2018

(30) Foreign Application Priority Data

Nov. 14, 2016 (JP) .................. 2016-221092

(51) Int. Cl.
*H03H 9/02* (2006.01)
*H03H 9/24* (2006.01)
(Continued)

(52) U.S. Cl.
CPC ....... *H03H 9/02448* (2013.01); *B81B 7/0041* (2013.01); *B81C 1/00182* (2013.01); *B81C 1/00698* (2013.01); *H03H 9/02259* (2013.01); *H03H 9/02433* (2013.01); *H03H 9/1057* (2013.01); *H03H 9/2405* (2013.01); *H03H 9/2463* (2013.01); *B81B 2201/0271* (2013.01);
(Continued)

(58) Field of Classification Search
CPC ........... H03H 9/02448; H03H 9/02433; H03H 9/2463; H03H 9/02259; H03H 9/1057; H03H 9/2405; H03H 2009/02472; H03H 3/0072; B81C 1/00698; B81C 1/00182; B81B 7/0041; B81B 2203/04; B81B 2201/0271; H02N 11/00–008
USPC .................... 310/300, 309; 73/579; 257/416, 257/E21.214
See application file for complete search history.

(56) References Cited

U.S. PATENT DOCUMENTS

2002/0160599 A1 10/2002 Aoyama et al.
2004/0036175 A1 2/2004 Aoyama et al.
(Continued)

FOREIGN PATENT DOCUMENTS

JP 2002-289687 A 10/2002
JP 2012-58127 A 3/2012
(Continued)

*Primary Examiner* — Thomas Truong
(74) *Attorney, Agent, or Firm* — Sughrue Mion, PLLC (57) ABSTRACT

A vibration transducer includes a silicon substrate, a first oxide film formed on the silicon substrate, an activation layer formed on the first oxide film, a second oxide film formed on the activation layer, a polysilicon layer formed on the second oxide film, and a substrate contact part. A vibrator, a vibrator electrode electrically conducted with the vibrator, a fixed electrode close to the vibrator and a vacuum chamber configured to surround the vibrator are formed in the activation layer. The polysilicon layer forms a shell. The substrate contact part is configured to electrically conduct the polysilicon layer and the silicon substrate, and is formed to continuously surround the vacuum chamber in a region, in which the vibrator, the vibrator electrode and the fixed electrode of the activation layer are not formed, of the activation layer.

9 Claims, 8 Drawing Sheets

(51) Int. Cl.
  *H03H 9/10* (2006.01)
  *B81B 7/00* (2006.01)
  *B81C 1/00* (2006.01)
(52) U.S. Cl.
  CPC .............. *B81B 2203/04* (2013.01); *H03H 2009/02472* (2013.01)

(56) References Cited

U.S. PATENT DOCUMENTS

| | | |
|---|---|---|
| 2005/0191841 A1 | 9/2005 | Aoyama et al. |
| 2012/0060607 A1* | 3/2012 | Yoshida .................. G01L 1/106 73/579 |
| 2012/0261800 A1 | 10/2012 | Graham et al. |
| 2014/0151855 A1 | 6/2014 | Graham et al. |
| 2015/0042208 A1* | 2/2015 | Yoshida ............... H03H 3/0072 310/321 |
| 2015/0211949 A1 | 7/2015 | Fujita et al. |

FOREIGN PATENT DOCUMENTS

| | | |
|---|---|---|
| JP | 2014-515884 A | 7/2014 |
| WO | 2014/050229 A1 | 4/2014 |

\* cited by examiner

VIBRATION TRANSDUCER

CROSS-REFERENCE TO RELATED APPLICATION

The present application claims priority from Japanese Patent Application No. 2016-221092 filed on Nov. 14, 2016, the entire content of which is incorporated herein by reference.

BACKGROUND

Technical Field

The present invention relates to a vibration transducer, and more particularly, to a technology for preventing a malfunction due to gas permeation.

Related Art

A vibration transducer is a device configured to measure an applied physical amount by detecting a change in resonance frequency of a vibrator formed on a silicon substrate. The vibration transducer is widely used for a transmitter and the like, as a MEMS (Micro Electro Mechanical Systems) device such as a pressure sensor, an acceleration sensor, an angular velocity sensor, a resonator and the like.

In the related art, the vibration transducer is formed so that a planar surface-side of a long plate-shaped vibrator having both ends fixed is parallel with a chip-shaped silicon substrate, and is configured to vibrate in an upper and lower direction of the silicon substrate. Patent Document 1 discloses a vibration transducer formed so that a planar surface-side of a vibrator is perpendicular to a silicon substrate and configured to vibrate in a horizontal direction of the silicon substrate. Thereby, the forming process is simplified and the vibration transducer can be manufactured with high precision at low cost.

Figure 8A:
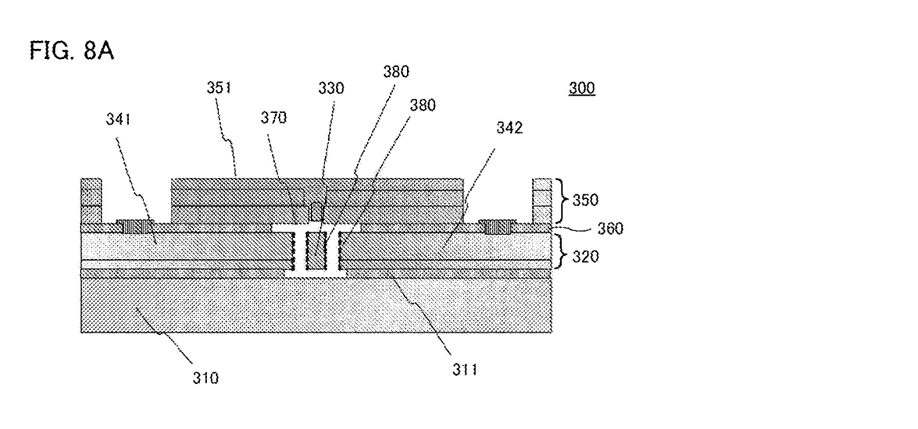
FIGS. 8A and 8B depict an assembled configuration of main parts of a vibration transducer disclosed in Patent Document 1.
Figure 8B:
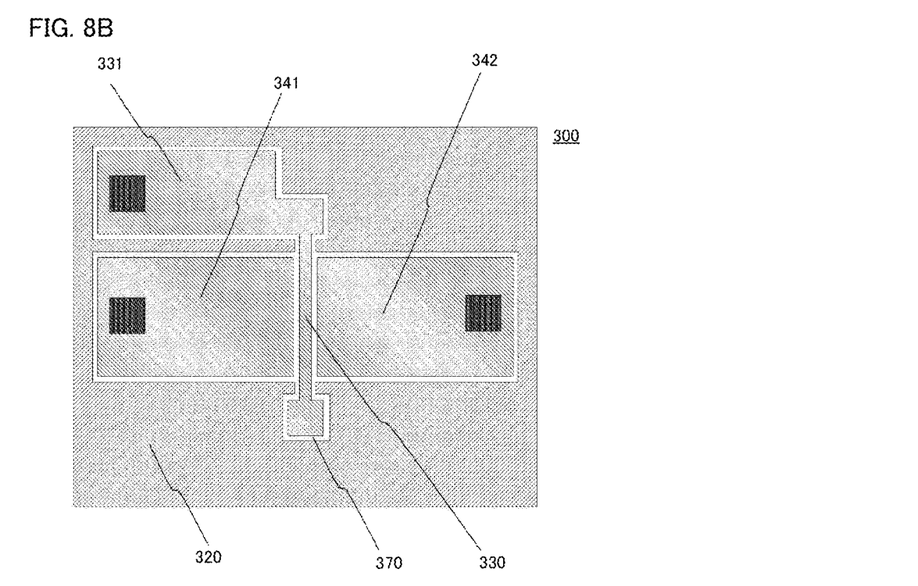

FIG. 8 depicts an assembled configuration of main parts of a vibration transducer 300 disclosed in Patent Document 1, in which FIG. 8A is a sectional view and FIG. 8B is a plan view of an activation layer part.

As shown in FIG. 8, the vibration transducer 300 has a structure where an activation layer 320 of silicon is processed to form a vibrator 330, a first electrode plate 341 and a second electrode plate 342 on an SOI substrate having a BOX layer oxide film 311 inserted between a silicon substrate 310 and a surface silicon layer (below the activation layer 320), an insulation oxide film 360 and an upper polysilicon layer 350 are additionally stacked and a shell 351 is formed by the upper polysilicon layer 350.

The first electrode plate 341 and the second electrode plate 342, which are fixed electrodes, are formed to sandwich the vibrator 330 therebetween, and a vacuum chamber 370 is formed around the vibrator 330. In addition, an electrode is formed at an end-side of the vibrator 330, too, and functions as a vibrator electrode plate 331.

Unevenness parts 380 for attachment prevention are formed on facing surfaces between the vibrator 330 and the first electrode plate 341 and between the vibrator 330 and the second electrode plate 342.

In the above configuration, when an excitation signal is applied to the first electrode plate 341 at a state where a bias voltage is applied between the vibrator electrode plate 331 and the second electrode plate 342, the vibrator 330 vibrates at a resonance frequency, and an electrostatic capacity between the vibrator 330 and the second electrode plate 342 changes, so that a current is output from the second electrode plate 342. The output current is converted into a voltage at a current-voltage conversion circuit using a calculation amplifier (not shown) and a frequency is detected by an output sensor. At this time, a combination of the voltage and signal to be applied to each electrode plate and the number of the electrode plates can be changed.

When different pressures are applied to the upper and lower parts of the vibration transducer 300, distortion is caused in the vibration transducer 300 and the resonance frequency of the vibrator 330 changes in correspondence to a magnitude of the distortion. For this reason, it is possible to obtain a difference between the applied pressures on the basis of the change in detected frequency.

CITATION LIST

Patent Literature

Patent Document 1: JP-A-2012-58127
Patent Document 2: JP-A-2014-515884
Patent Document 3: WO2014/050229
Patent Document 4: JP-A-2002-289687

In the vibration transducer 300 of the related art, the BOX layer oxide film 311 and the insulation oxide film 360 communicate from a side surface of the vibration transducer 300 to the vacuum chamber 370. The oxide film has a gas permeability higher than a silicon layer and a polysilicon layer. When there are low molecular gases such as hydrogen, helium and the like around the vibration transducer 300, the gases may permeate the vacuum chamber 370 via the oxide film. When the gases permeate the vacuum chamber 370, a degree of vacuum is lowered, so that an excitation defect of the vibrator 330 may be caused.

SUMMARY

Exemplary embodiments provide a vibration transducer which can prevent a malfunction due to gas permeation into a vacuum chamber A vibration transducer comprises:
a silicon substrate;
a first oxide film formed on the silicon substrate;
an activation layer formed on the first oxide film;
a second oxide film formed on the activation layer;
a polysilicon layer formed on the second oxide film; and
a substrate contact part,
wherein a vibrator, a vibrator electrode electrically conducted with the vibrator, a fixed electrode close to the vibrator and a vacuum chamber configured to surround the vibrator are formed in the activation layer,
wherein the polysilicon layer forms a shell, and
wherein the substrate contact part is configured to electrically conduct the polysilicon layer and the silicon substrate, and is formed to continuously surround the vacuum chamber in a region, in which the vibrator, the vibrator electrode and the fixed electrode of the activation layer are not formed, of the activation layer.

A plurality of the substrate contact parts may be formed in the activation layer.

A pad configured to be electrically conduced with the vibrator electrode, a pad configured to be electrically conducted with the fixed electrode, and a substrate contact pad configured to be electrically conducted with the silicon substrate may be provided at the polysilicon layer-side.

Diodes may be formed between the vibrator electrode and the silicon substrate and between the fixed electrode and the silicon substrate.

The diodes may be formed by the region, in which the vibrator, the vibrator electrode and the fixed electrode are not formed, of the activation layer and a diffusion having a conductivity type different from a conductivity type of the region formed in the region.

The diodes may be formed by the respective electrodes and a diffusion having a conductivity type different from a conductivity type of each electrode formed in each electrode.

A diode for temperature sensor may be formed separately from the diodes in the region in which the vibrator, the vibrator electrode and the fixed electrode are not formed, of the activation layer.

According to the exemplary embodiment, it is possible to prevent a malfunction due to the gas permeation into the vacuum chamber in the vibration transducer.

DETAILED DESCRIPTION

Figure 1A:
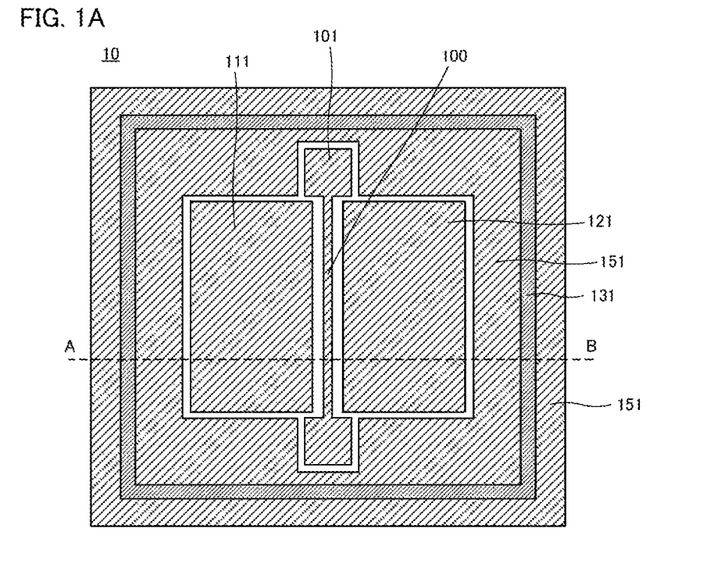
FIGS. 1A and 1B depict a basic structure of a vibration transducer of the present invention.
Figure 1B:
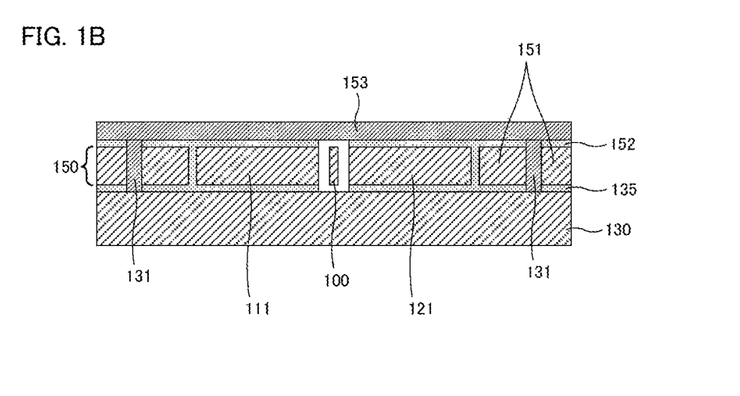

Embodiments of the present invention will be described with reference to the drawings. FIGS. 1A and B depict a basic structure of a vibration transducer 10 of the present invention, in which FIG. 1A is a plan view depicting an activation layer, and FIG. 1B is a sectional view taken along a line A-B.

As shown in FIGS. 1A and B, a vibration transducer 10 has a structure where an activation layer 150 of silicon is processed to form a vibrator 100, a first electrode plate 111 and a second electrode plate 121 on an SOI substrate having a BOX layer oxide film 135 inserted between a silicon substrate 130 and a surface silicon layer (the activation layer 150), and an insulation oxide film 152 and an upper polysilicon layer 153 are additionally stacked.

The first electrode plate 111 and the second electrode plate 121, which are fixed electrodes, are formed to sandwich the vibrator 100 therebetween, and a vacuum chamber is formed around the vibrator 100. In addition, an electrode is formed at an end-side of the vibrator 100, too, and functions as a vibrator electrode plate 101.

In the vibration transducer 10, the silicon substrate 130 is electrically connected to the activation layer 150 (referred to as 'peripheral activation layer 151') except for the electrode plates and the vibrator, and the upper polysilicon layer 153, through a substrate contact part 131 of polysilicon or silicon.

The substrate contact part 131 is formed to continuously surround the vacuum chamber without discontinuity. The vacuum chamber is surrounded by the substrate contact part 131 of polysilicon or silicon, so that a gas permeation path of the oxide film is discontinued. Therefore, it is possible to prevent an excitation defect of the vibrator 100 due to deterioration of a degree of vacuum of the vacuum chamber.

Figure 2:
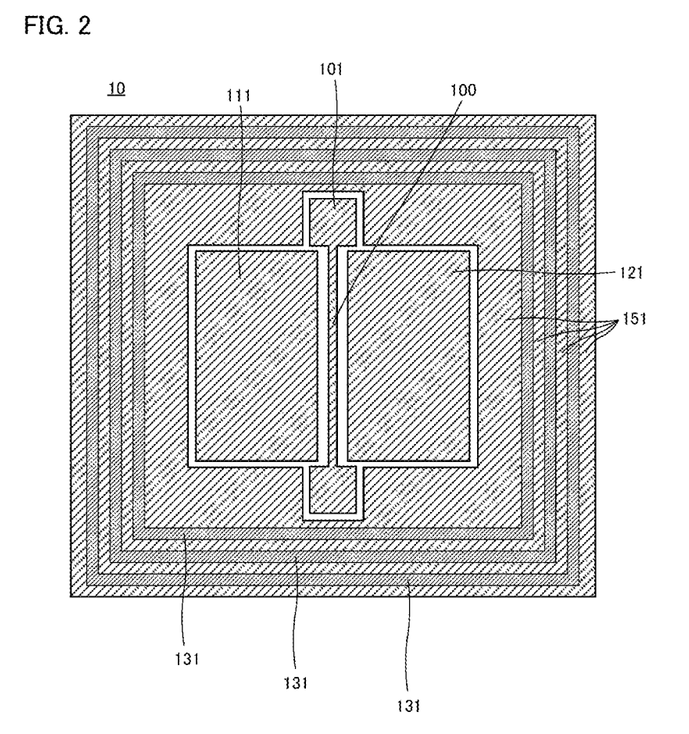
FIG. 2 depicts an example where a substrate contact part configured to surround a vacuum chamber is triplicated.

Since it is thought that the gas permeation of the oxide film is progressed by gas diffusion, a lifetime of the vibration transducer by the gas permeation is proportional to a square of a thickness of a film to be permeated. When the substrate contact part 131 is formed in multiplicity, a width of the silicon or polysilicon discontinuing the gas permeation path of the oxide film is also increased, so that it is possible to further prolong the lifetime of the vibration transducer. FIG. 2 depicts an example where the substrate contact part 131 is triplicated; that is, three of substrate contact parts 131, 131, 131 are formed. The configuration of forming the substrate contact part 131 in multiplicity (that is, forming a plurality of the substrate contact parts) can be applied to any embodiment to be described later.

Figure 3A:
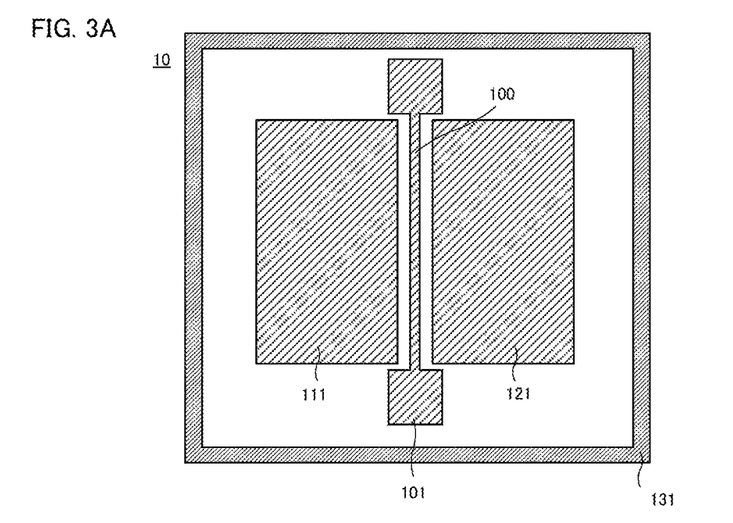
FIGS. 3A and 3B depict a first embodiment of the vibration transducer of the present invention.
Figure 3B:
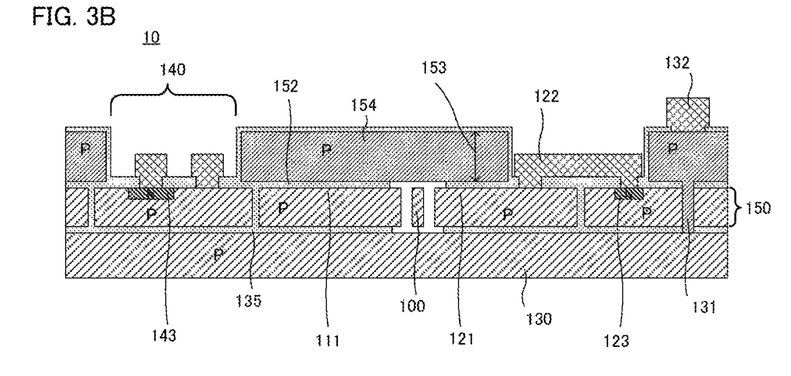

FIGS. 3A and B depict a first embodiment of the vibration transducer 10 of the present invention to which the basic structure is applied, in which FIG. 3A is a plan view of the activation layer and FIG. 3B is a sectional view. In FIG. 3A, the activation layer except for the vibrator and the electrode plates is omitted.

In the first embodiment, the activation layer 150 of silicon is processed to form the vibrator 100, the first electrode plate 111 and the second electrode plate 121 on the SOI substrate having the BOX layer oxide film 135 inserted between the silicon substrate 310 and the surface silicon layer (the activation layer 150), the insulation oxide film 152 and the upper polysilicon layer 153 are additionally stacked and a shell 154 is formed by the upper polysilicon layer 153.

The first electrode plate 111 and the second electrode plate 121, which are fixed electrodes, are formed to sandwich the vibrator 100 therebetween, and the vacuum chamber is formed around the vibrator. In addition, an electrode is formed at an end-side of the vibrator 100, too, and functions as the vibrator electrode plate 101. Unevenness parts may be formed on respective facing surfaces between the vibrator 100 and the first electrode plate 111 and between the vibrator 100 and the second electrode plate 121. Also, the number of the fixed electrodes may be changed.

In the first embodiment, all of the silicon substrate 130, the activation layer 150 and the upper polysilicon layer 153 are P-types. The silicon substrate 130 is electrically connected to the activation layer 150 (referred to as 'peripheral activation layer 151') except for the electrode plates and the vibrator, and the upper polysilicon layer 153 including the shell 154, through the substrate contact part 131. Herein, the substrate contact part 131 is formed to continuously surround the vacuum chamber without discontinuity (only a part is shown in FIG. 3B).

The upper polysilicon layer 153 making electrical conduction with the substrate contact part 131 is electrically conducted with a substrate contact pad 132 formed on a surface of the vibration transducer 10. In the meantime, the substrate contact part 131 may be formed by partially removing the peripheral activation layer 151 and the BOX layer oxide film 135 below the same and again filling the removed portions with polysilicon to which P-type impurities have been diffused.

In this way, since the substrate contact pad 132 electrically connected to the silicon substrate 130 is formed on the surface of the vibration transducer 10 (the upper polysilicon layer 153-side), it is possible to apply a potential to the silicon substrate 130 from the surface, like the other electrode plates. For this reason, it is possible to save trouble of applying a potential from a backside (the silicon substrate 130-side) via a base for fixing a chip of the vibration transducer 10 thereon, or the like, and to simplify the structure.

When the potential is applied from the substrate contact pad 132 to the silicon substrate 130, it is possible to collectively apply the same potential to the peripheral activation layer 151 and the upper polysilicon layer 153, too. In the first embodiment, since the substrate contact pad 132 is grounded, the peripheral activation layer 151 and the upper polysilicon layer 153 are also earthed.

In the meantime, when the silicon substrate 130 is not electrically fixed, each electrode and the silicon substrate 130 are capacitively connected, so that the vibration transducer 10 may not obtain a sufficient output. Therefore, the silicon substrate 130 is required to be electrically contacted. In the first embodiment, as described above, since the substrate contact pad 132 is provided, it is possible to apply the potential to the silicon substrate 130 from the surface, like the other electrode plates. This also applies to the other embodiments to be described later.

In the first embodiment, the P-type peripheral activation layer 151 is formed with the N-type diffusion to configure a protection diode and to connect with the vibrator electrode plate 101, the first electrode plate 111 and the second electrode plate 121. The N-type diffusion may be formed by performing the impurity diffusion with the oxide film being used as a mask, for example.

Herein, the reason to configure the protection diode is described. That is, in the vibration transducer of the related art shown in FIGS. 8A and B, since the unevenness parts 380 are formed on the respective facing surfaces between the vibrator 330 and the first electrode plate 341 and between the vibrator 330 and the second electrode plate 342, it is possible to prevent the mutual attachment in a normal using aspect.

However, when the electrostatic discharge (ESD) or the like is applied to the electrode plate, the silicon substrate 310 or the like and the large discharge current is thus caused to flow, it is not possible to completely prevent the current by the unevenness parts 380, and the vibrator 330 may be contacted to the surrounding members, for example, the first electrode plate 341, the second electrode plate 342, the silicon substrate 310 and the shell 351 and fused.

Therefore, in the embodiment, the vibrator 100 is prevented from being contacted to the surrounding members and fused by releasing the electricity to the ground via the protection diode even when the electrostatic discharge (ESD) is applied to any one of the vibrator electrode plate 101, the first electrode plate 111 and the second electrode plate 121.

The protection diode is formed in the peripheral activation layer 151 outside the electrode plate, and is electrically conducted with the electrode plate via the electrode pad. Specifically, as shown in FIG. 3B, the second electrode plate 121 is electrically conducted with a protection diode diffusion 123 formed in the peripheral activation layer 151 via a second electrode plate pad 122. This applies to the vibrator electrode plate 101 and the first electrode plate 111, too.

Since the peripheral activation layer 151 is electrically connected to the silicon substrate 130 by the substrate contact part 131, each of the vibrator electrode plate 101, the first electrode plate 111 and the second electrode plate 121 is diode-connected to the silicon substrate 130. In the first embodiment, the vibrator electrode plate 101, the first electrode plate 111 and the second electrode plate 121 become a cathode-side.

Also, in the first embodiment, a part of the P-type activation layer independent of the electrode plate and the peripheral activation layer 151 is formed with an N-type temperature sensor diffusion 143, so that a temperature sensor diode 140 is configured. Herein, electrical characteristics of the diode highly depend on temperatures, and a forward voltage substantially linearly decreases as the temperature increases, under a constant current condition. For this reason, it is possible to enable the diode 140 as a temperature sensor by forming an electrode pad to be electrically conducted with the N-type temperature sensor diffusion 143 and an electrode pad in a part of the P-type activation layer independent of the peripheral activation layer 151 and measuring a forward voltage under constant current.

In general, when mounting the vibration transducer 10, it is required to prepare a temperature sensor for temperature compensation. However, in the first embodiment, since it is possible to easily configure the temperature sensor diode 140 in the vibration transducer 10 by the same process as the protection diode to be connected to the electrode plate, it is possible to arrange a temperature sensor for temperature compensation in the same chip as the vibrator 100 without preparing the same as a separate chip.

In the meantime, the shapes, sizes and arrangements of the vibrator 100, each electrode pad, each protection diode, and the temperature sensor diode 140 are not limited to the shown example. For example, each electrode pad of aluminum to be plastically deformed is preferably arranged with being spaced from the vibrator 100 upon the mounting so as to avoid a drift of an output. In this case, the protection diode and the temperature sensor diode 140 are also arranged with being spaced from the vibrator 100.

Figure 4:
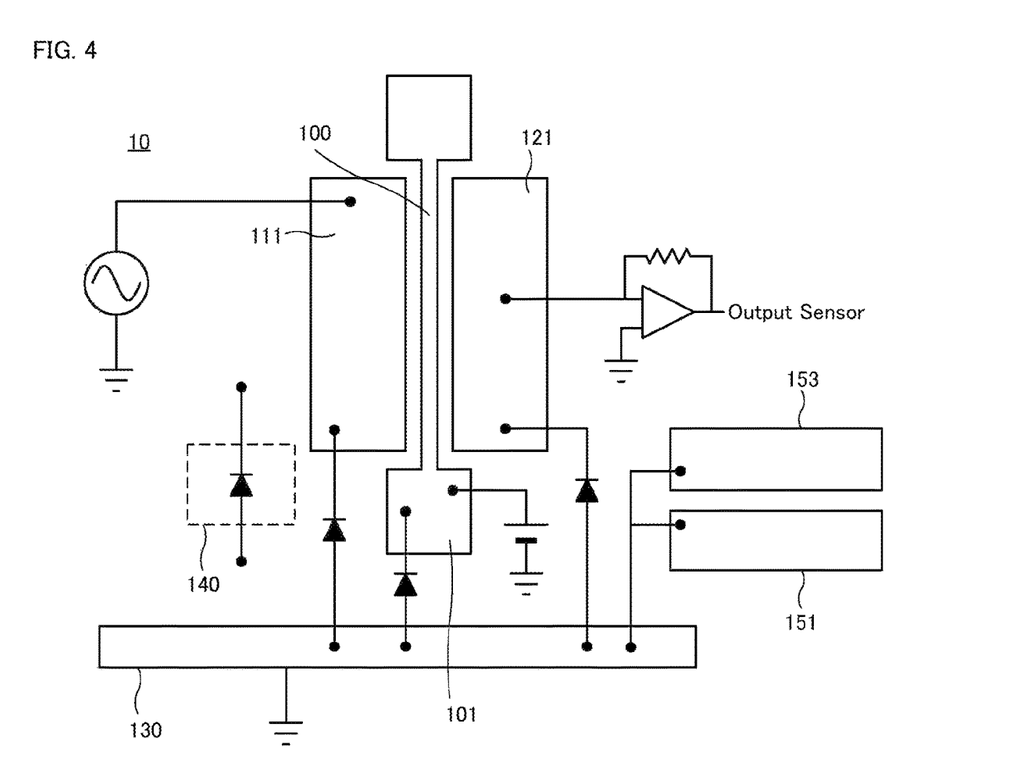
FIG. 4 depicts a circuit of the vibration transducer of the first embodiment upon operation.

FIG. 4 depicts a circuit of the vibration transducer 10 of the first embodiment upon operation. As shown in FIG. 4, when an excitation signal is applied to the first electrode plate 111 at a state where a bias voltage is applied between the vibrator electrode plate 101 and the second electrode plate 121, the vibrator 100 vibrates at a resonance frequency, and an electrostatic capacity between the vibrator 100 and the second electrode plate 121 changes, so that a current is output from the second electrode plate 121. The output current is converted into a voltage at a current-voltage conversion circuit using a calculation amplifier and a frequency is detected by an output sensor. In the meantime, the circuit upon the operation is not limited to the shown example.

When different pressures are applied to the upper and lower parts of the vibration transducer 10, distortion is caused in the vibration transducer 10 and the resonance frequency of the vibrator 100 changes in correspondence to a magnitude of the distortion. For this reason, it is possible to obtain a difference between the applied pressures on the basis of the change in detected frequency.

An anode-side of each protection diode having a cathode-side electrically conducted with the vibrator electrode plate 101, the first electrode plate 111 and the second electrode plate 121 is electrically conducted with the earthed silicon substrate 130. Also, all of the upper polysilicon layer 153 and the peripheral activation layer 151 have the same potential as the silicon substrate 130.

In the above configuration, even when the electrostatic discharge (ESD) is applied to any one of the vibrator electrode plate 101, the first electrode plate 111 and the second electrode plate 121, it is possible to release the electricity to the ground via the protection diode. Specifically, when a low voltage is applied to the electrode-side, the protection diode becomes on, so that the electricity is released to the ground, and when a high voltage is applied to the electrode-side, the protection diode is yielded, so that the electricity can be released to the earth.

For this reason, it is possible to prevent the vibrator 100 and the first electrode plate 111 and second electrode plate 121 from being contacted and fused due to the discharge current resulting from the electrostatic discharge and the like. In the meantime, in a voltage range to be applied to each electrode plate in the normal using aspect, since the electrical conduction is not made with any protection diode, the measurement is not influenced.

Also, even when the electrostatic discharge (ESD) is applied to any one of the upper polysilicon layer 153, the peripheral activation layer 151 and the silicon substrate 130, since they are earthed, they are not influenced.

In the first embodiment, since the silicon substrate 130, the upper polysilicon layer 153 and the peripheral activation layer 151 are electrically conducted in the chip via the substrate contact part 131, it is possible to reduce a resistance, as compared to a case where the connection is made from a backside via a base for fixing. If a resistance is high, when the electrostatic discharge (ESD) is applied to any one, a potential difference is caused, and a risk that the vibrator 100 and the silicon substrate 130 and shell 154 will be contacted and fused by the discharge current increases. From this point, the configuration of the first embodiment has an advantage.

Figure 5A:
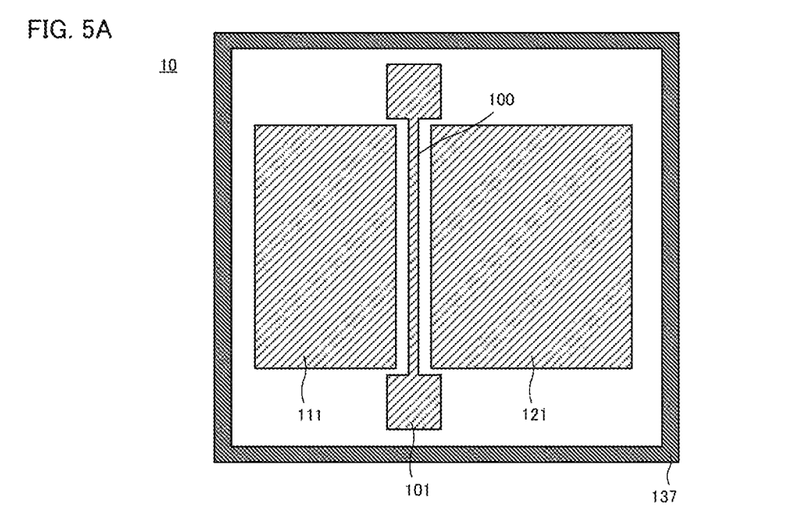
FIGS. 5A and 5B depict a second embodiment of the vibration transducer of the present invention.
Figure 5B:
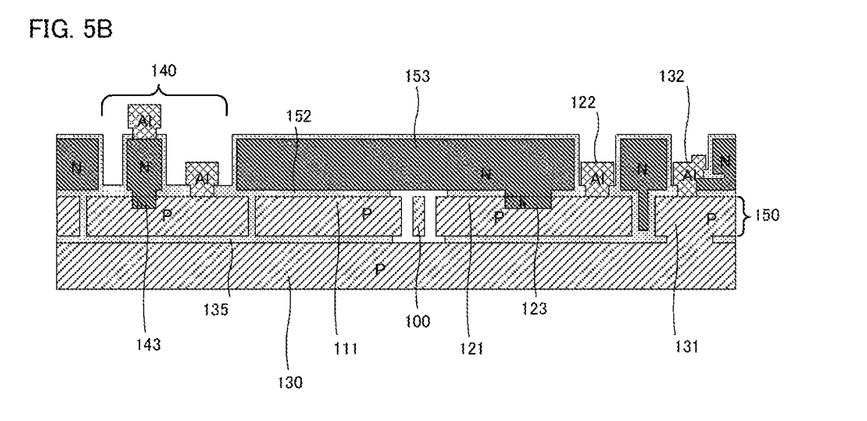

Subsequently, a second embodiment of the vibration transducer 10 of the present invention is described with reference to FIGS. 5A and B. In the below, the differences from the first embodiment are mainly described.

In the second embodiment, the silicon substrate 130 and the activation layer 150 are the P-types, like the first embodiment. However, the upper polysilicon layer 153 is an N-type. The silicon substrate 130 is electrically conducted with the peripheral activation layer 151 through the substrate contact part 131. In the second embodiment, the activation layer and the BOX layer oxide film 135 on the SOI substrate having the thin activation layer are partially removed, and the activation layer 150 is adjusted to have a desired thickness by an epitaxial growth. The partially removed place becomes the substrate contact part 131, so that the silicon substrate 130 and the peripheral activation layer 151 are electrically conducted.

In the shown example, a substrate contact part 137 formed to continuously surround the vacuum chamber without discontinuity is formed separately from the substrate contact part 131. However, the substrate contact part 131 may be formed to continuously surround the vacuum chamber without discontinuity with being in contact with the upper polysilicon layer 153 (in FIG. 5B, the substrate contact part 137 is omitted).

The upper polysilicon layer 153 including the shell 154 is electrically conducted with the silicon substrate 130 by the substrate contact pads 132 formed on the surface of the vibration transducer 10. For this reason, also in the second embodiment, it is possible to apply the potential to the silicon substrate 130 from the surface, and to apply the same potential to the peripheral activation layer 151 and the upper polysilicon layer 153 from the surface at the same time, too.

In the second embodiment, each electrode plate of the P-type (the vibrator electrode plate 101, the first electrode plate 111 and the second electrode plate 121) is formed with the N-type diffusion to configure the cathode of the protection diode and to make contact and electrical conduction of the cathode with the upper polysilicon layer 153. At this time, the activation layer 150 of each electrode becomes the anode.

Specifically, as shown in FIG. 5B, the second electrode plate 121 is formed with the protection diode diffusion 123 to configure the cathode and to make electrical conduction of the cathode with the upper polysilicon layer 153. The vibrator electrode plate 101 and the first electrode plate 111 are also the same. The upper polysilicon layer 153 is electrically conducted with the peripheral activation layer 151 via the substrate contact pad 132 and with the silicon substrate 130 via the substrate contact part 131.

Figure 6:
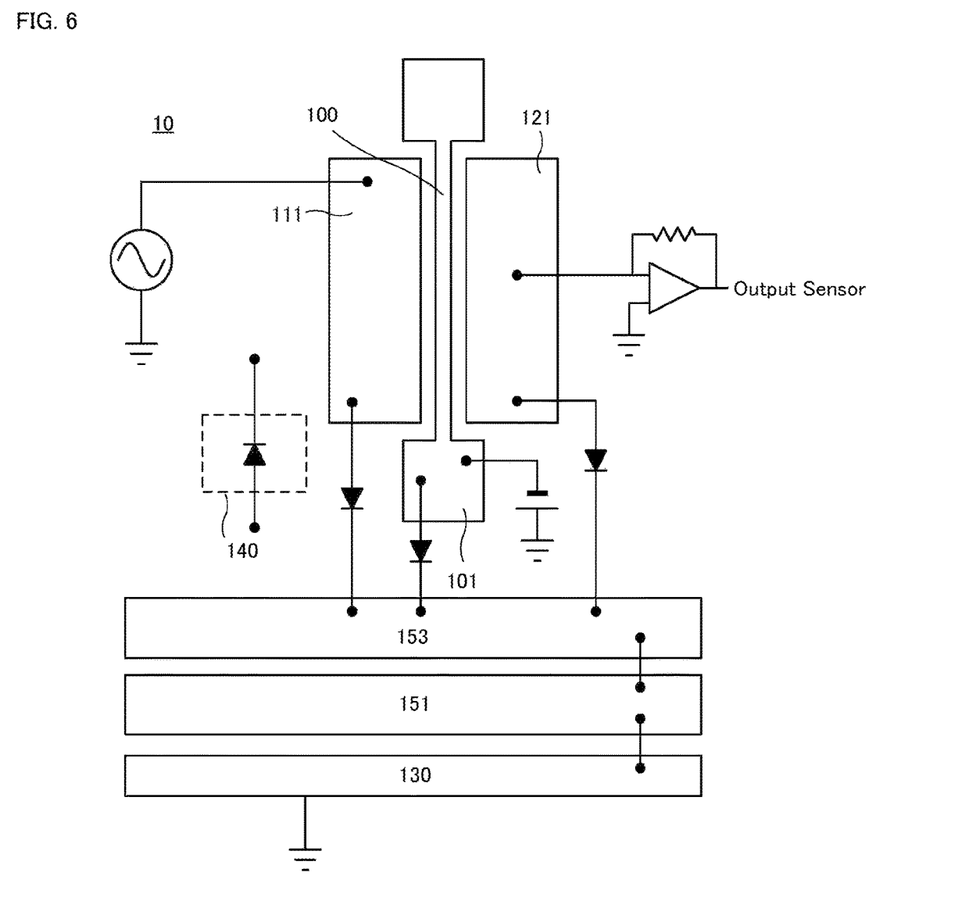
FIG. 6 depicts a circuit of the vibration transducer of the second embodiment upon operation.

The temperature sensor diode 140 is configured by forming the N-type temperature sensor diffusion 143 in a part of the P-type activation layer independent of the P-type peripheral activation layer 151 and forming an electrode pad for temperature sensor via the upper polysilicon layer 153 of which the impurity concentration has been increased. For this reason, the circuit of the vibration transducer 10 of the second embodiment upon the operation is as shown in FIG. 6, and the operations thereof are substantially the same as the first embodiment although the polarities of the protection diode are reversed.

In a manufacturing process, the part of each electrode plate of the P-type, in which the N-type diffusion is formed, and the upper polysilicon layer 153 are directly contacted, and the N-type diffusion of each electrode plate can be performed at the same time when diffusing the impurities into the upper polysilicon layer 153.

In the configuration of the second embodiment, even when the electrostatic discharge (ESD) is applied to any one of the vibrator electrode plate 101, the first electrode plate 111 and the second electrode plate 121, it is possible to release the electricity to the ground via the protection diode. Specifically, when a high voltage is applied to the electrode-side, the protection diode becomes on, so that the electricity is released to the ground, and when a low voltage is applied to the electrode-side, the protection diode is yielded, so that the electricity can be released to the earth.

For this reason, it is possible to prevent the vibrator 100 and the first electrode plate 111 and second electrode plate 121 from being contacted and fused due to the discharge current resulting from the electrostatic discharge and the like. In the meantime, in a voltage range to be applied to each electrode plate in the normal using aspect, since the electrical conduction is not made with any protection diode, the measurement is not influenced.

Also, even when the electrostatic discharge (ESD) is applied to any one of the upper polysilicon layer 153, the peripheral activation layer 151 and the silicon substrate 130, since they are earthed, they are not influenced. The other merits are the same as the first embodiment.

Figure 7A:
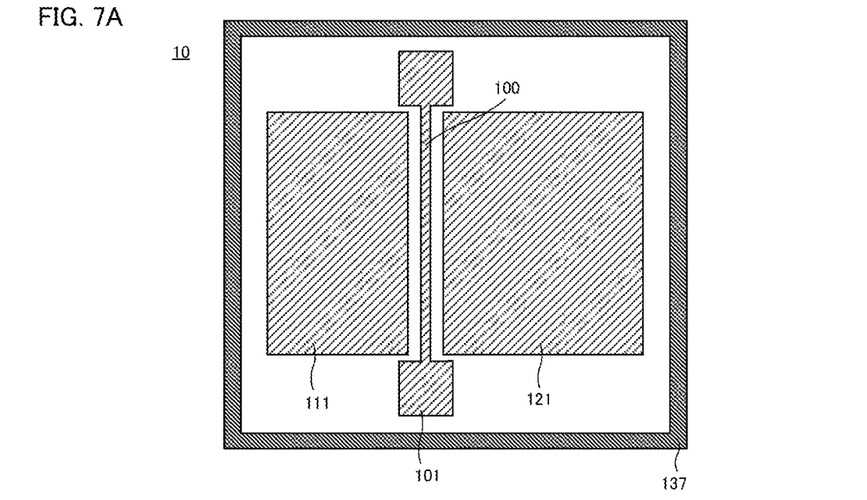
FIGS. 7A and 7B depict a third embodiment of the vibration transducer of the present invention.
Figure 7B:
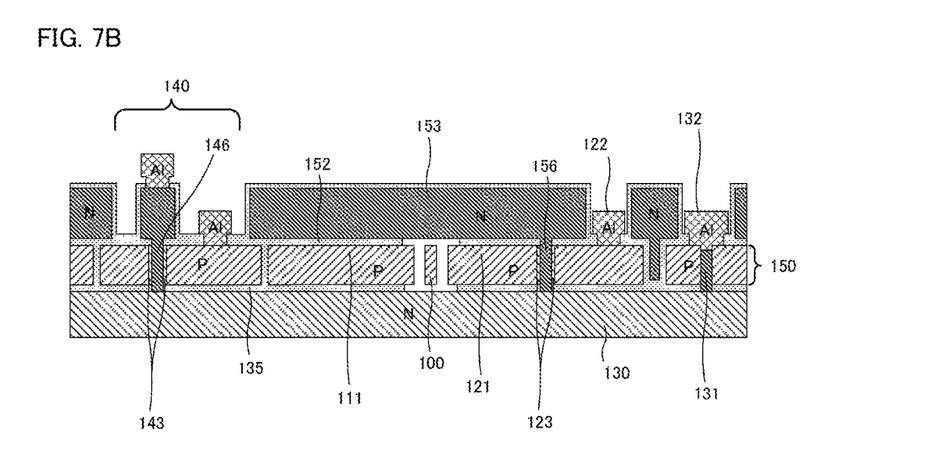

Subsequently, a third embodiment of the vibration transducer 10 of the present invention is described with reference to FIGS. 7A and B. In the below, the differences from the first and second embodiments are mainly described.

In the third embodiment, the silicon substrate 130 is the N-type, the activation layer 150 is the P-type, and the upper polysilicon layer 153 is the N-type. The silicon substrate 130 is electrically conducted with the substrate contact pads 132 formed on the surface of the peripheral activation layer 151 through the substrate contact part 131 formed by removing parts of the peripheral activation layer 151 and the BOX layer oxide film 135 and again filling the removed parts with the N-type polysilicon.

In the shown example, the substrate contact part 137 formed to continuously surround the vacuum chamber without discontinuity is formed separately from the substrate contact part 131. However, the substrate contact part 131 may be formed to continuously surround the vacuum chamber without discontinuity with being in contact with the upper polysilicon layer 153 (in FIG. 7B, the substrate contact part 137 is omitted).

Also, the silicon substrate 130 is electrically conducted with the upper polysilicon layer 153 via an upper layer contact part 156 formed by removing parts of the activation layer 150 configuring the electrode plate and the BOX layer oxide film 135 and again filling the removed parts with the N-type polysilicon.

For this reason, also in the third embodiment, it is possible to apply the potential to the silicon substrate 130 from the surface, and to apply the same potential to the peripheral activation layer 151 and the upper polysilicon layer 153 from the surface at the same time, too.

In the third embodiment, the cathode of the protection diode is formed by diffusing the N-type impurities from the N-type polysilicon again filled when forming the upper layer contact part 156 into the surrounding activation layer 150 forming the electrode plate, and the cathode is electrically conducted with the upper polysilicon layer 153 via the upper layer contact part 156. At this time, the activation layer 150 of each electrode becomes the anode. Since the N-type diffusion is formed in the single crystal part of the activation layer 150, the favorable diode is obtained.

Specifically, as shown in FIG. 7B, the second electrode plate 121 is formed with the protection diode diffusion 123 to configure the cathode, and the cathode is electrically conducted with the upper polysilicon layer 153. The vibrator electrode plate 101 and the first electrode plate 111 are also the same. The upper polysilicon layer 153 is electrically conducted with the silicon substrate 130 via the upper layer contact part 156 and with the peripheral activation layer 151 via the substrate contact part 131.

The temperature sensor diode 140 is formed with a temperature sensor contact part 146 by removing parts of the activation layer and the BOX layer oxide film 135 at a part of the P-type activation layer independent of the peripheral activation layer 151 and filling the removed parts with the N-type polysilicon and is formed with a temperature sensor diffusion 143 by diffusing the N-type impurities into the surrounding peripheral activation layer 151. For this reason, the circuit of the vibration transducer 10 of the third embodiment upon the operation is equivalent to a configuration where the cathode of the temperature sensor diode 140 is connected to the silicon substrate 130 in the circuit of the second embodiment shown in FIG. 6.

Like the second embodiment, in the third embodiment, even when the electrostatic discharge (ESD) is applied to any one of the vibrator electrode plate 101, the first electrode plate 111 and the second electrode plate 121, it is possible to release the electricity to the ground via the protection diode. Specifically, when a high voltage is applied to the electrode-side, the protection diode becomes on, so that the electricity is released to the ground, and when a low voltage is applied to the electrode-side, the protection diode is yielded, so that the electricity can be released to the earth.

For this reason, it is possible to prevent the vibrator 100 and the first electrode plate 111 and second electrode plate 121 from being contacted and fused due to the discharge current resulting from the electrostatic discharge and the like. In the meantime, in a voltage range to be applied to each electrode plate in the normal using aspect, since the electrical conduction is not made with any protection diode, the measurement is not influenced.

Also, even when the electrostatic discharge (ESD) is applied to any one of the upper polysilicon layer 153, the peripheral activation layer 151 and the silicon substrate 130, since they are earthed, they are not influenced. The other merits are the same as the first embodiment.

What is claimed is:

1. A vibration transducer comprising:
   a silicon substrate;
   a first oxide film formed on the silicon substrate;
   an activation layer formed on the first oxide film;
   a second oxide film formed on the activation layer;
   a polysilicon layer formed on the second oxide film; and
   a substrate contact part,
   wherein a vibrator, a vibrator electrode electrically conducted with the vibrator, a fixed electrode close to the vibrator and a vacuum chamber configured to surround the vibrator are formed in the activation layer,
   wherein the polysilicon layer forms a shell, and
   wherein the substrate contact part is configured to electrically conduct the polysilicon layer and the silicon substrate, and is formed to continuously surround the vacuum chamber in a region, in which the vibrator, the vibrator electrode and the fixed electrode of the activation layer are not formed, of the activation layer.

2. The vibration transducer according to claim 1, wherein a plurality of the substrate contact parts are formed in the activation layer.

3. The vibration transducer according to claim 1, wherein a pad configured to be electrically conduced with the vibrator electrode, a pad configured to be electrically conducted with the fixed electrode, and a substrate contact pad configured to be electrically conducted with the silicon substrate are provided at the polysilicon layer-side.

4. The vibration transducer according to claim 1, wherein diodes are formed between the vibrator electrode and the silicon substrate and between the fixed electrode and the silicon substrate.

5. The vibration transducer according to claim 4, wherein the diodes are formed by the region, in which the vibrator, the vibrator electrode and the fixed electrode are not formed, of the activation layer and a diffusion having a conductivity type different from a conductivity type of the region formed in the region.

6. The vibration transducer according to claim 4, wherein the diodes are formed by the respective electrodes and a diffusion having a conductivity type different from a conductivity type of each electrode formed in each electrode.

7. The vibration transducer according to claim 4, wherein a diode for temperature sensor is formed separately from the diodes in the region in which the vibrator, the vibrator electrode and the fixed electrode are not formed, of the activation layer.

8. The vibration transducer according to claim 1, wherein the substrate contact part is formed to continuously surround the vibrator, the vibrator electrode, the fixed electrode and the vacuum chamber of the activation layer.

9. The vibration transducer according to claim 1, wherein the fixed electrode comprises:
   a first electrode plate; and
   a second electrode plate, and wherein the first electrode plate and the second electrode plate are formed to sandwich the vibrator.

* * * * *